(12) United States Patent
Davies

(10) Patent No.: US 12,014,896 B2
(45) Date of Patent: Jun. 18, 2024

(54) COST EFFECTIVE PROBING IN HIGH VOLUME MANUFACTURE OF MICRO LEDs

(71) Applicant: ATTOLIGHT AG, Lausanne (CH)

(72) Inventor: Matthew J. Davies, Wangen im Allgaeu (DE)

(73) Assignee: ATTOLIGHT AG, Lausanne (CH)

( * ) Notice: Subject to any disclaimer, the term of this patent is extended or adjusted under 35 U.S.C. 154(b) by 332 days.

(21) Appl. No.: 17/579,309

(22) Filed: Jan. 19, 2022

(65) Prior Publication Data
US 2022/0230841 A1   Jul. 21, 2022

Related U.S. Application Data

(60) Provisional application No. 63/138,863, filed on Jan. 19, 2021.

(51) Int. Cl.
*H01J 37/244* (2006.01)
*H01J 37/22* (2006.01)

(52) U.S. Cl.
CPC .......... *H01J 37/244* (2013.01); *H01J 37/228* (2013.01)

(58) Field of Classification Search
CPC .............. H01J 37/244; H01J 37/228; H01J 2237/2808; G01N 2223/6116; G01N 23/2254
See application file for complete search history.

(56) References Cited

U.S. PATENT DOCUMENTS

| 3,845,305 | A |   | 10/1974 | Liebl |   |
|---|---|---|---|---|---|
| 4,929,041 | A | * | 5/1990 | Vahala | H01J 37/244 385/116 |
| 5,264,704 | A | * | 11/1993 | Phang | H01J 37/228 850/18 |
| 5,825,478 | A |   | 10/1998 | Wilcox et al. |   |
| 7,589,322 | B2 | * | 9/2009 | Nishikata | H01J 37/256 250/306 |

(Continued)

FOREIGN PATENT DOCUMENTS

| FR | 2173436 A5 | 9/1973 |
|---|---|---|
| JP | 2008249478 A | 10/2008 |

(Continued)

OTHER PUBLICATIONS

Davies, et al. "Scrutinising GaN HEMTs by quantitative cathodoluminescence", Compound Semiconductor, vol. 26, Issue 8 (Nov./Dec. 2020), cover page and pp. 18-24 (7 pages total).

(Continued)

*Primary Examiner* — David A Vanore
(74) *Attorney, Agent, or Firm* — WOMBLE BOND DICKINSON (US) LLP; Joseph Bach, Esq.

(57) ABSTRACT

A wafer having µLEDs is inspected using cathodoluminescence microscopes. A fast scan is enabled by splitting the CL beam into several beams and sensing the beams with point detectors. Optical filters are inserted in the optical path upstream of the detectors, such that each detector senses a different frequency band. The signals are ratioed and the ratios are compared to expected reference. Regions of extreme value are identified and, if desired, a high resolution scan is performed on the regions or a sample of the regions. Viability score is calculated for each identified region.

20 Claims, 9 Drawing Sheets

(56) References Cited

U.S. PATENT DOCUMENTS

| | | | |
|---|---|---|---|
| 2003/0053048 A1* | 3/2003 | Bennett | G01J 3/02 |
| | | | 356/301 |
| 2009/0141264 A1 | 6/2009 | Shibata et al. | |
| 2012/0205539 A1* | 8/2012 | Hlavenka | H01J 37/224 |
| | | | 250/307 |
| 2013/0200262 A1* | 8/2013 | Kruit | H01J 37/256 |
| | | | 250/311 |
| 2013/0335817 A1 | 12/2013 | Isobe et al. | |
| 2016/0027609 A1* | 1/2016 | Sharma | H01J 37/261 |
| | | | 250/307 |
| 2019/0103248 A1 | 4/2019 | Niu et al. | |
| 2022/0020559 A1* | 1/2022 | Monachon | H01J 37/045 |
| 2022/0051868 A1 | 2/2022 | Hamada et al. | |
| 2022/0075170 A1* | 3/2022 | Froigneux | G01J 3/021 |
| 2022/0178854 A1* | 6/2022 | Fouchier | G01N 23/2254 |
| 2022/0216028 A1* | 7/2022 | Jean | H01J 37/1475 |
| 2022/0230841 A1* | 7/2022 | Davies | H01J 37/228 |

FOREIGN PATENT DOCUMENTS

| | | |
|---|---|---|
| TW | 202029268 A | 8/2020 |
| WO | 0233368 A1 | 4/2002 |
| WO | 2020225453 A2 | 11/2020 |

OTHER PUBLICATIONS

Monachon, et al. "Quantitative cathodoluminescence streamlines chip production", Compound Semiconductor, vol. 25, Issue 5 (Jun. 2019), cover page and pp. 18-22 (6 pages total).

Monachon, et al. "Advances In Cathodoluminescence: Recent Steps Toward Semiconductor Fabs and FA Labs", Electronic Device Failure Analysis, vol. 22, No. 4 (Nov. 2020), pp. 28-33.

PCT International Search Report and Written Opinion from related Application No. PCT/IB2022/050448, dated Jun. 15, 2022 (17 pages).

* cited by examiner

COST EFFECTIVE PROBING IN HIGH VOLUME MANUFACTURE OF MICRO LEDs

RELATED APPLICATIONS

This Application claims priority benefit from U.S. Provisional Application, Ser. No. 63/138,863, filed Jan. 19, 2021, the disclosure of which is incorporated herein by reference in its entirety.

TECHNICAL FIELD

The present disclosure relates to cathodoluminescence microscopes and, more specifically, methods for probing μLEDs using cathodoluminescence microscopes to effectively monitor the high-volume manufacturing of μLEDs.

BACKGROUND

MicroLED or μLED, is an emerging flat-panel display technology, consisting of arrays of microscopic LEDs forming the individual red/blue/green pixel elements. A standard 4K display has 3840×2160 image pixels, i.e., over eight million pixels, each made of three color pixels for red/blue/green, amounting to about 25 million individual micro LEDs. As the human eye is very sensitive to color changes, the light emission of each of these LEDs must be uniform in intensity and color, and the response to activation potential must be uniform as well. Thus, it is important to test these LEDs during production to ensure that the fabricated LEDs will be operating properly.

Applicant has previously disclosed a novel scanning cathodoluminescence microscopes in e.g., PCT/EP2020/063093, the disclosure of which is incorporated herein in its entirety by reference. The microscope operates based on the observation that when the electron beam of a scanning electron microscope (SEM) scans a sample, the electrons interact with the sample, producing various signals that can be detected and that contain information about the sample's surface topography, structure and composition. The types of signals produced by an SEM include secondary electrons (SE), back-scattered electrons (BSE), characteristic or bremsstrahlung X-rays, light, absorbed/induced current (EBAC/EBIC) and transmitted electrons (TEM). The light (defined as photons with energies ranging from 0.1 to 10 eV approximately) emitted by a specimen upon electron bombardment is called cathodoluminescence (CL).

Cathodoluminescence measurements can be performed in a scanning electron microscope by scanning the highly focused electron beam probe of the electron microscope over the surface of the specimen and recording the cathodoluminescence signal intensity as a function of the electron beam position on the specimen. A cathodoluminescence map (also referred to herein as an image or CL image) may be generated, which provides higher resolution spectroscopic information than would a wide field light optical image obtained by a light microscope. For the purpose of this disclosure, it is assumed that the reader would be familiar with the above cited disclosure. For other disclosures of CL microscopes, the reader is referred to: U.S. Pat. No. 3,845,305, U.S. Pub. Nos. 2013/0335817 and 2019/0103248, and French Pat. No. 2173436.

The LEDs are fabricated on semiconductor wafers and as the size of the LEDs is reduced, the number of the LEDs on the wafer increase. Applicant has investigated the possibility of using its CL microscope as a contactless method to test LED during front-end manufacturing, i.e., when the LEDs are still on the wafer. The subject inventor has noted that as the size of the LEDs shrinks, the time it would take to make conventional electro-optic testing, where physical electrical contact is required, of one wafer would be prohibitive. For example, while it would take about an hour to electro-optically test a wafer having chip size of 1000 microns, inspecting a wafer with 50 micron chip size would take two weeks, inspecting a wafer with 10 micron chip size would take about one year, and inspecting a wafer with 5 micron chip size would take about four years. Thus, the subject inventor sought to develop new hardware and new testing strategy to make contactless testing of a full wafer having micro LEDs (i.e., chip size of 100 microns or less) feasible.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

It is an aim of the present disclosure to enable identification and classification of micro LED chips within a semiconductor wafer. The hardware and methods disclosed herein may be used to develop and to monitor the front-end production of micro LEDs. Using the apparatus and methods disclosed herein it is possible to, e.g., determine changes in process steps that affect the fabricated micro LEDs, detect excursions in the fabrication process, detect failure in one or more steps of the fabrication process, to identify non-salvageable wafers to be discarded without further processing, or to classify/bin the LED chips according to uniformity/performance.

According to a disclosed aspect, a CL microscope is fitted with beam splitter to split the incoming CL beam into several beams. Various filters are inserted in the optical paths of the split beams and separate point detectors are positioned to detect light passing through the filters. The signals from the point detectors is used to analyse the characteristics of the fabricated micro LEDs within the inspected wafer. Each of the point detectors may be a biased photodiode, avalanche photodiode, amplified photodiode or photomultiplier tube (PMT).

In disclosed embodiments, cathodoluminescence microscope is provided for inspecting wafers having a plurality of micro LEDs formed therein, the microscope comprising: an electron beam column having an electron source, a magnetic lens for focusing electrons emitted from the electron source to thereby form an electron beam, and a scanner scanning the electron beam over a wafer; a light objective collecting CL light emitted from the sample in response to the scanning of the electron beam and forming a CL light beam; a beam splitting arrangement simultaneously generating a plurality of split beams from the CL light beam, wherein the plurality of split beams are inherently registered both spatially and temporally; a filter arrangement positioned to intersect an optical path of at least one of the CL light beam or at least one of the split beams; and a plurality of point detectors, each positioned to detect one of the split beams. In an embodiment, a different filter is placed in the optical path of each of the split beams except for one of the split beams, such that one of the point detectors generates a panchromatic image while the remaining detectors generate filtered images. Still, in other embodiment, a filter can be used in the otherwise non-filtered channel, so as to separate the emission corresponding to the LED from the GaN bulk emission that occurs between the chips. A filter that blocks emissions below 400 nm is useful to remove GaN bulk emission, but otherwise pass the full spectrum of the mesa emission. In further embodiments, one or more dichroic beam splitters may be used in order to perform the beam splitting as well as the filtering part concurrently, though still at least one panchromatic reference can be generated without a filter or with a 400 nm filter to block the GaN bulk emission. The microscope may comprise a controller integrating the signal received from each of the point detectors to generate a plurality of integrated emissions, and analysing the integrated emissions to determine structural and optical parameters of the micro LEDs.

According to disclosed aspects a computer program stored in a storage device is provided that, when executed by a computer causes the computer to execute steps comprising: receiving a first electrical signal corresponding to a first filtered cathodoluminescence beam and a second electrical signal corresponding to a second filtered cathodoluminescence beam having different filtered wavelengths from the first filtered cathodoluminescence beam; integrating the first and second electrical signals to generate first integrated signal and second integrated signal; using the first and second integrated signals to reconstruct an emission spectra curve; analysing the emission spectra curve to determine characteristics of the micro LEDs. Analysing the emission spectra curve may include determining peak wavelength shift, emission intensity variation, FWHM (The full width at half maximum), etc. The processor may further assign viability score to each region of the sample according to the emission spectra curve, the viability score being indicative of high viability areas wherein LEDs within the region are likely to be within acceptable specification, low viability area wherein LEDs within the region are likely out of acceptable specification and do not merit further investigation, and borderline viability regions wherein LEDs in the region merit further in-depth investigation.

According to further aspects, a method of operating a cathodoluminescence microscope to determine physical and optical properties of micro LEDs within a semiconductor sample is disclosed, comprising: scanning the sample with an electron beam at a first resolution; collecting cathodoluminescence light emitted from the area during the scanning and forming a light beam from the cathodoluminescence light; splitting the light beam into a plurality of split beams; filtering at least a subset of the plurality of split beams; using a plurality of point detectors to simultaneously detect the split beams and generate a plurality of electrical signals, each corresponding to intensity of one of the split beams; analysing the plurality of signals to identify suspect regions within the sample; scanning each of the suspect regions with the electron beam at a second resolution, higher than the first resolution; collecting cathodoluminescence light emitted from the suspect region during the scanning and forming a second light beam from the cathodoluminescence light; splitting the second light beam into a plurality of second split beams; inserting the plurality of filters in the optical path of the subset of the second split beams; using the plurality of point detectors to simultaneously detect the second split beams and generate a second plurality of electrical signals, each corresponding to one of the second split beams; analysing the plurality of second signals to assign a viability score to each of the suspect regions. The method may further include detecting secondary electrons emitted from the suspect region and analysing an image generated by the secondary electrons to determine the shape of LED within the suspect region and/or determine whether contaminants are present within the suspect region. The method may further include generating a full spectrum CL image using an assembly of a spectrograph and a detector array to detect the second light beam.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

Other features and advantages of the invention will become apparent from the following description of non-limiting exemplary embodiments, with reference to the appended drawings, in which.

DETAILED DESCRIPTION

Figure 1:
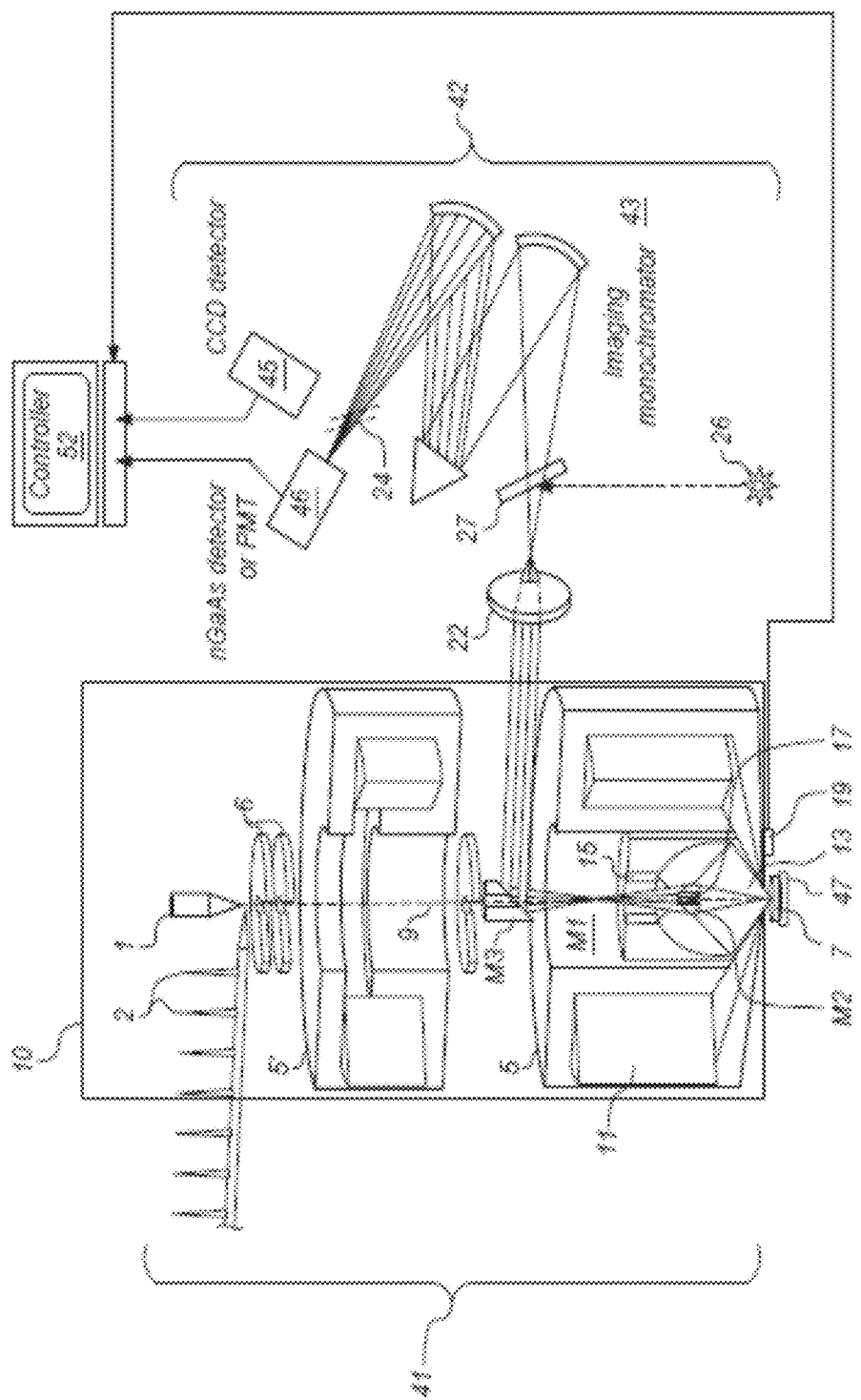
FIG. 1 is a schematic cross-sectional view of a lower portion of a cathodoluminescence scanning electron microscope for implementing embodiments disclosed herein.

Some embodiments of the present invention are described below in more detail with reference to the attached figures. Similar functional and structural elements which appear in the different drawings may be assigned the same reference numerals.

Embodiments of the inventive cathodoluminescence scanning electron microscope and methods of operation will now be described with reference to the drawings. Different embodiments or their combinations may be used for different applications or to achieve different benefits. Depending on the outcome sought to be achieved, different features disclosed herein may be utilized partially or to their fullest, alone or in combination with other features, balancing advantages with requirements and constraints. Therefore, certain features, elements or benefits will be highlighted with reference to different embodiments, but are not limited to the disclosed embodiments. That is, the features, elements and benefits disclosed herein are not limited to the embodiment within which they are described, but may be "mixed and matched" with other features and incorporated in other embodiments, even if such are not explicitly described herein.

FIG. 1 shows a lower portion of a CL microscope in cross-sectional view, which is more fully described in the above-cited PCT/EP2020/063093. As illustrated in FIG. 1, the microscope generally includes an electron column 41 that is housed within vacuum enclosure 10, and imaging section 42, which is in atmospheric environment. The integrated microscope shown in FIG. 1 can generate an electron beam image, a light beam image, a cathodoluminescence (CL) image, and a CL spectrographic image. The imaged CL emissions can be correlated to the structure and quality of the sample's material at the nano-scale. The CL data can reveal material stress, impurities, crystallographic, and subsurface defects that are not visible using other imaging modes. Importantly, the CL imaging is a non-destructive method of inspecting a sample.

The electron column includes an electron source 1, such as a thermionic or field emission source, that emits electrons. The emitted electrons are made into electron beam 9 by the various particle-optics elements, such as electromagnetic lens 5', electromagnetic objective 5, and aperture disks (sometimes referred to as stops) 6. Note that any of the aperture disks 6 may function as an electrostatic lens by application of potential thereto. In a known manner, coils 11 are provided to generate a magnetic field. Most of the magnetic field may be located at the level of an output or exit aperture 13, or instead it could be outside of that region between the lens and the specimen.

The purpose of the magnetic field is to generate a converging electron beam 9 which can be focused on to the surface of the sample 7. In this example, the electron beam 9, which is generated by the electron emitter 1, propagates from the top of the figure downwards. The electron beam span may be modified by a condenser arrangement, such as a lens 5', so that it can either diverge, be collimated or converge. The condenser may be placed below the electron emitter. The electron beam typically has a width in the range of a few millimetres, for example between 2 and 3 mm.

The lens 5 has a hollow interior along its optical axis, so that the electron beam 9 can pass through. The hollow part (passage or gap) is wide enough so that light emitted by or reflected from the sample 7, can also pass through without much obstruction. Since it is preferable to keep the output aperture 13 of the electromagnetic objective lens 5 as small as possible in order to keep good electron optical performance, it is preferable to build the system so that the working distance stays small.

As can be seen, a reflective objective is provided within the electromagnetic objective lens 5 for imaging the surface of the sample 7. In this example a Schwarzschild reflective objective is used. A Schwarzschild objective is a two mirror reflective objective, which is rotationally symmetric about the optical axis z (essentially coinciding with the path of the electron beam), is aplanatic and infinity-corrected. The electromagnetic objective lens 5 and the reflective objective may have the same focal plane. The reflective objective within the electromagnetic objective 5 comprises a first mirror M1, also referred to as the primary mirror, which in this example is spherical and concave, and a second mirror M2 also referred to as the secondary mirror, which in this example is spherical and convex. The diameter of the first mirror M1 is larger than the diameter of the second mirror M2. The first mirror M1 is located above the second mirror M2 and is arranged to reflect the light coming from the sample as a result of the electron beam 9 hitting the surface of the sample 7, and to direct the light towards the second mirror M2 placed between the sample and the first mirror M1. The second mirror M2 is arranged to redirect the light along the optical axis of the electromagnetic objective (i.e., upwards), and a third mirror, M3, which in this example is planar, is arranged to redirect the light beam towards an output. In this example the third mirror M3 has a 45° angle with respect to the electron beam 9 axis and is used to redirect the light out of the vacuum enclosure 10. All the three mirrors M1, M2 and M3 have an aperture or opening along the electron beam path so that the electron beam is not obstructed.

In the light imaging section 42, the light reflected by mirror M3 is focused by lens 22 onto an imaging monochromator 43. In this example, two imagers are provided, a detector array, e.g., CCD camera 45 and a point detector 46, such as an InGaAs or PMT detector. If mirror 24 is a half mirror, then both imagers can be operated simultaneously. Conversely, mirror 24 may be a flip mirror, enabling operating one imager at a time. With this arrangement, detector 46 can be used to detect light intensity of a specified wavelength, while CCD camera may be used to detect light intensity at several wavelengths simultaneously.

The CL microscope has been used to inspect semiconductors to detect defects. In this disclosure the CL microscope is adapted for inspection of micro LEDs, specifically, to inspect wafers having multiple micro LEDs prior to being cut into separate dies or chips. The apparatus and processes described herein may be used both during development of micro LED manufacturing process and during the actual high-volume manufacturing of micro LEDs. In either case, it is beneficial to performed the inspection on structured wafers, for example early in the frontend post-mesa etch or at the end of frontend pre-singulation. Henceforth the mesas on the structured wafer may be interchangeably referred to as chips, albeit unlike in the semiconductor fabrication, in LED fabrication one chip would normally a single LED. Conversely, in micro LED fabrication, singulating each micro LED on a single chip would render handling difficult and expensive. Therefoire, it is more likely that each singulated chip may include three micro LEDs for RGB rendering if the wafer is fabricated with multiple color micro LEDs. Thus, when the wafer is singulated into individual chips, each individual chip may have a single or several micro LED formed therein, but each micro LED is formed on a single mesa. Therefore, in terms of real estate on the wafer, the terms mesa and LED are interchangeable, while the term chip may refer to an area that includes one or several mesas.

As indicated above, a first issue that needs addressing when attempting to inspect a micro LED wafer is the sheer number of micro LEDs on each wafer, which drastically prolongs inspection time, rendering it unacceptable. Thus, a novel approach has been developed to overcome this problem. This novel approach is somewhat modular, in that it includes several sub-processes which can be utilized, rearranged or modified as necessary to enable testing at different stages of the LED fabrication process development and manufacturing maturity.

As explained with respect to FIG. 1, the CL microscope can generate a histogram of light emitted from the sample, which can be used to obtain in-depth information about the sample. Conversely, the point detector, such as photodiode or PMT, generates an intensity signal of whatever light it receives, such that it conveys less information than the CCD.

However, the advantage of the single point detector is that it is much faster than the CCD. Accordingly, the CL microscope has been modified to enable a fast scan at a rate of a point detector, but providing more meaningful information than what is provided by a single point detector.

Figure 2A:
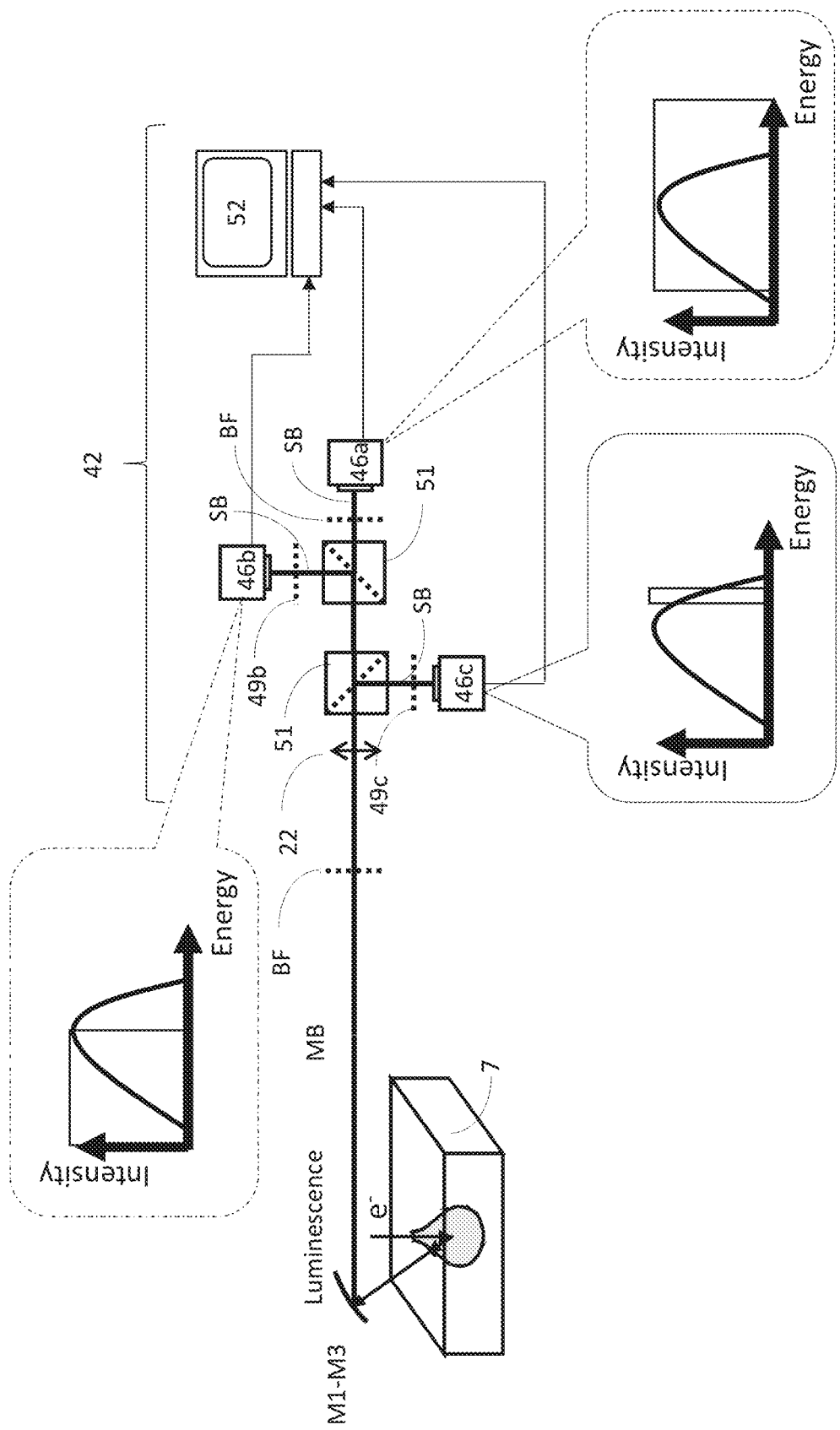
FIGS. 2A-2C are simplified schematic of image acquisition section of cathodoluminescence microscopes according to example embodiments.
Figure 2B:
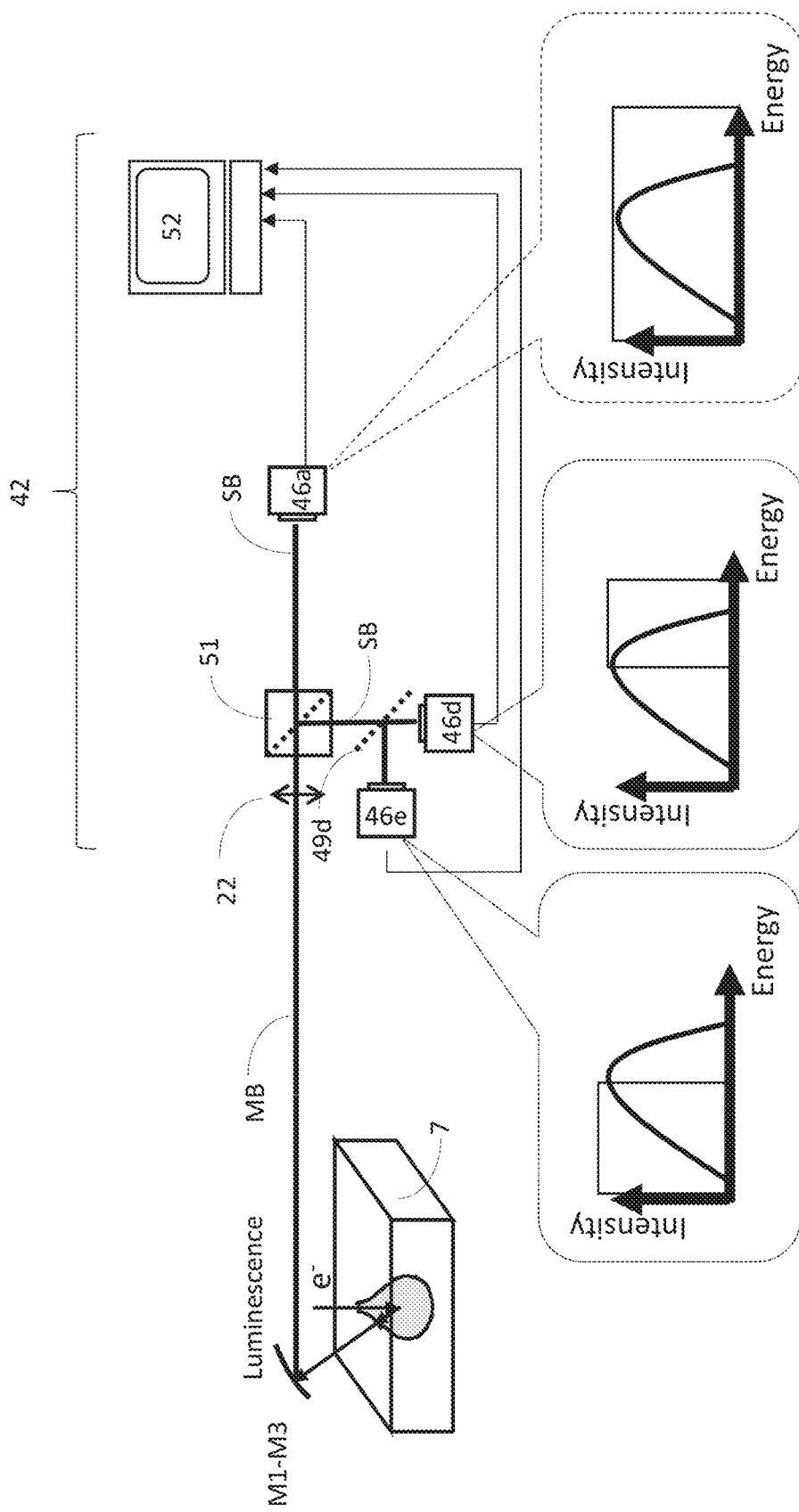
Figure 2C:
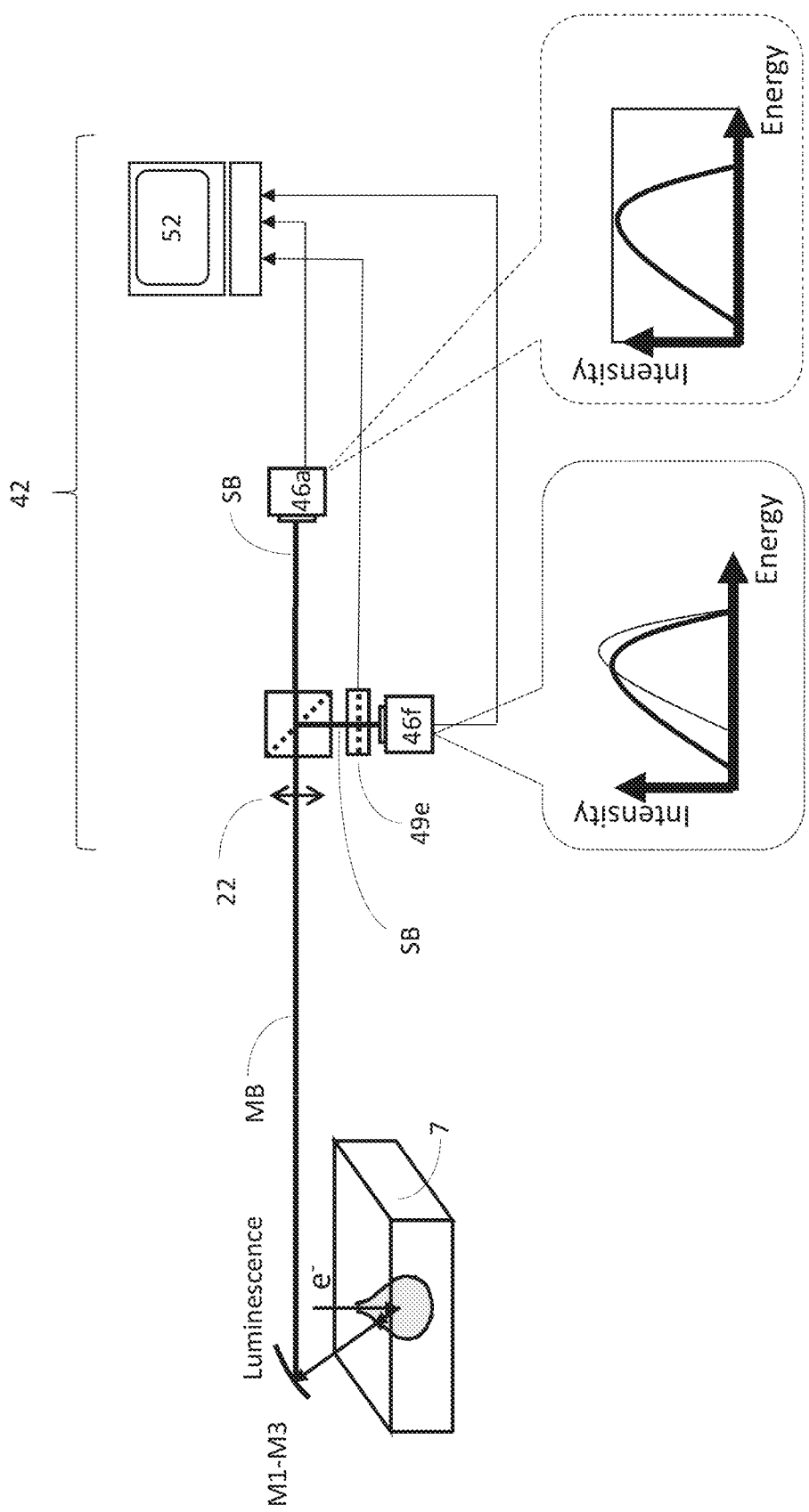

FIGS. 2A-2C illustrate embodiments of modified CL microscopes, wherein the point detector part of the CL microscope of FIG. 1 is enhanced. That is, the CCD, SE, and other detection and imaging elements of FIG. 1 have not been removed from the embodiments of FIGS. 2A-2C, but are not shown as the following description relates only to the single point detector part. In FIG. 2A, the main CL beam MB is split by a beam splitter arrangement, e.g., beam splitters 51, into a plurality of split beams SB, e.g., three split beams are illustrated but any number of plurality of split beams may be used—for most cases at least three split beams. A corresponding number of point detectors 46a-46f are positioned so that each receives one of the split beams. Each of the point detectors 46a-46f may be a biased photodiode, avalanche photodiode, amplified photodiode or photomultiplier tube (PMT). Additionally, a filtering arrangement, e.g., filters 49a and 49b, is inserted in the optical path of at least one or a subset of the split beams. Beneficial results can be obtained when one of the point detectors (here 46a) captures the full spectrum, i.e., the number of filters equals the number of split beam minus one. Optionally, a background filter BF may be inserted in the optical path of the main beam or upstream of the point detectors (here 46a) that captures the full spectrum. The background filter is designed to remove emissions that are generated from the wafer areas around the mesa, e.g., an optical filter blocking wavelengths below 400 nm.

In FIG. 2B the beam splitter arrangement is made up of beam splitter 51 that splits the main beam MB into two split beams, one of which directed at detector 46a for full spectrum detection, while the other directed at dichroic mirror 49d. Dichroic mirror 49d has different reflection and transmission properties, such that the reflected light and the transmitted light are at two different wavelengths. In this sense Dichroic mirror 49d acts as a beam splitter and a filter combined. The reflected split beam directed at detector 46e has a different wavelength and/or bandwidth than the split beam transmitted to detector 46d. In FIG. 2C one, or more, filters can be exchanged with a thinned piece of LED epiwafer, wherein a reverse bias voltage is applied between the front and back sides. The biased LED epiwafer in this configuration acts simultaneously as custom absorbing optical filter, with complex transmission profile, and as a photodetector.

Each of the callouts in FIGS. 2A-2C illustrates the CL spectrum received by each of the point detectors 46a-46f. The curve indicates the actual CL spectrum of the split beam upstream of the filter, while the rectangle indicates the spectrum that passes through the filter, i.e., the transmission range of the filter. As shown in the dashed callout, since no filter or only a background filter is applied to the split beam of point detector 46a, it receives the entire spectrum or the spectrum above 400 nm, so that the signal output by point detector 46a corresponds to the integrated intensity of the full spectrum (panchromatic) of the CL beam corresponding to the mesa. This is similar to the panchromatic (i.e., covering the entire spectrum the detector is sensitive to) signal of the non-filtered point detector 46 of FIG. 1. Conversely, as illustrated by the dotted callout, filter 49c is a high pass filter having a narrow bandwidth, so that the signal output by point detector 46c corresponds to the integrated intensity of narrow band, high energy spectrum of the CL beam. Also, as illustrated in the dash-dot callout, filter 49b is a wide bandwidth low pass filter, such that the signal output by point detector 46b corresponds to the integrated intensity of wide band, low energy spectrum of the CL beam. Similarly, in FIG. 2B the dichroic mirror 49d reflects light at the low frequency band while transmits light at the high frequency band.

Thus, the systems of FIGS. 2A-2C generate one panchromatic image and multiple filtered images of different energy centers and energy bands. Notably, these are just examples and any number, types, and combinations of beam splitters, mirrors and filters may be used; however, for beneficial results the resulting split beams should be different from each other, such that the resulting signals output of the point detectors would be different. The mirrors and filters may include edge pass, bandpass, or filters with more complex transmission properties. As illustrated, in FIG. 2B, a special class of filter, called dichroic mirror, 49d is used, such that both the filtered and transmitted parts of the signal can be detected in detectors 46d and 46e. This simplifies the design and optimizes the overall photon collection efficiency. In FIG. 2C, a special custom optical filter 49f is implemented in the form of a reverse biased LED epiwafer, such that both the transmitted light can be detected in detector 46f and the light absorbed by the filter can be recorded as a photocurrent in a reverse biased LED epiwafer. In this sense, the reverse biased LED epiwafer functions as a beam splitter (as it passes some of the light and absorbs another part of the light), as a filter (as it passes light at different energy band than the light it absorbs), and as a detector (as it output current correlating with the absorbed light).

Thus, a cathodoluminescence microscope is provided for inspecting wafers having a plurality of micro LEDs formed therein, the microscope comprising: an electron beam column having an electron source, a magnetic lens for focusing electrons emitted from the electron source to thereby form an electron beam, and a scanner scanning the electron beam over the sample; a light objective collecting CL light emitted from the sample in response to the scanning of the electron beam and forming a CL light beam; a beam splitting arrangement simultaneously generating a plurality of split beams from the CL light beam, wherein the plurality of split beams are inherently registered both spatially and temporally; a filtering arrangement positioned to filter at least one of the split beams; a plurality of point detectors, each positioned to detect one of the split beams; and a controller receiving output signals from the plurality of point detectors and generating therefrom a panchromatic image and a plurality of filtered images. The controller may further operate to integrate the signal received from each of the point detectors to generate a plurality of integrated emissions, and analysing the integrated emissions to determine characteristics of the micro LEDs. The controller may further operate to generate a plurality of ratios, each comprising a ratio of the signal received from two of the plurality of point detectors.

Figures 3, 4:
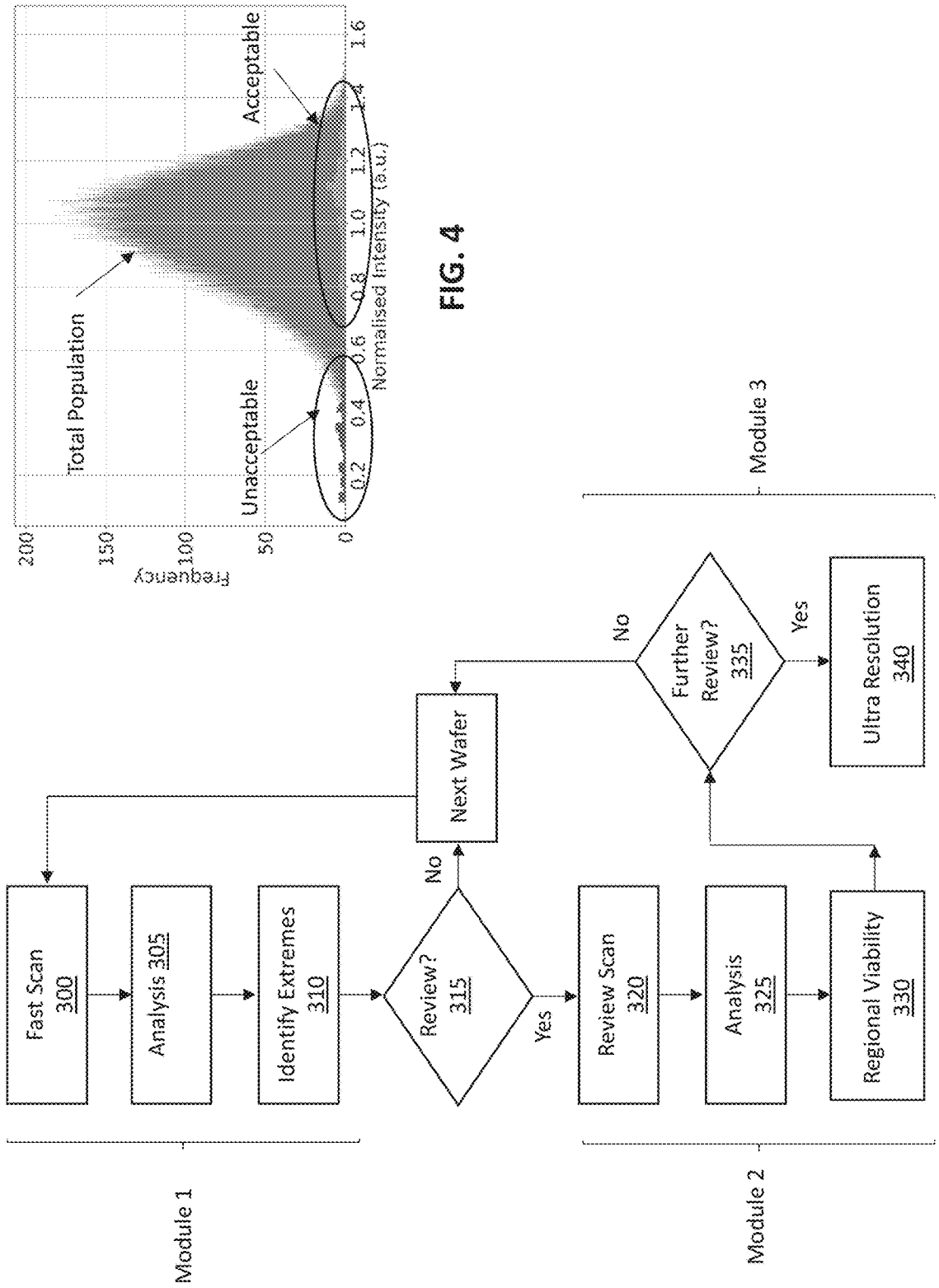
FIG. 3 is a flow chart illustrating a process for assessing micro LED properties and performance and classifying defects according to an embodiment.
FIG. 4 is a plot of CL intensity for total population and for individual regions, according to an embodiment.

FIG. 3 illustrates a flow chart of processes utilizing the CL microscope to inspect micro LED wafers, according to an embodiment. The processes disclosed herein may be divided into three modules which may be included or omitted from a workflow, depending on the specific testing environment (process development or manufacturing) and the maturity of the fabrication process. For example, only module 1 may be required as monitoring method when inspecting wafers undergoing a mature manufacturing process, while all three modules may be implemented during micro LED technology development.

Regardless of the workflow implemented, if the workflow includes inspection, it start with the fast scan 300 of module 1 (otherwise, if only sampling of the wafer is desired, one can skip to the second or third modules). The fast scan is performed on a global area, meaning the entire wafer or several large areas that together encompass a substantial fraction of the wafer such that it forms adequate representation of the entire wafer. The fast scan is a low resolution scan with spatial resolution of, e.g., from 250 μm to 250 nm, depending on the size of the target mesa. The resolution can be adjusted by, e.g., the sampling rate of the point detectors. In an embodiment the spatial resolution is set so that at least one data point is collected from each individual mesa (LED) in the global area, and beneficially it is set so that a plurality of data points are obtained from each mesa. For example, the scan resolution can be set to obtain 2×2, 3×3, 4×4, 5×5, 6×6 or up to 10×10 pixels per mesa. For example, for wafers having mesa size of 10 microns, setting the resolution for a 4×4 pixels per mesa would result in a 2.5 micron spatial resolution, while for wafer having one micron mesas, a 4×4 pixels per mesa would be 250 nm spatial resolution.

During the fast scan each of the point detectors output a signal corresponding to the CL emission at a defined band of energies (all energies when no filtering is used). In an embodiment, the data obtained from the point detectors is analyzed in 305 to identify suspect regions in which the optical properties deviate from a defined expectation 310. In an embodiment, the point detectors data for each spatial scan position is used to roughly reconstruct the spectral emission at that location. For example, the signal from the unfiltered split beam can be used to determine the total emission intensity, and using differential analysis (e.g., taking ratios of the signals of the point detectors) it is possible to estimate emission intensity per wavelength and determine parameters related to the emission FWHM, asymmetry of the emission, i.e. ratio of the low energy half maximum to high energy half maximum (which ultimately affects colour rendering of the LED).

As an example of differential analysis, if five point detectors are used, one panchromatic and four with filters, the five intensity signal can be: panchromatic signal, $I_p$, low-pass narrow-band signal, $I_{LNB}$, low-pass wide-band signal, $I_{LWB}$, high-pass narrow-band signal, $I_{HNB}$, high-pass wide-band signal, $I_{HWB}$. Additionally, it is possible to form the signals: $I_{LNB}/I_p$, $I_{LWB}/I_p$, $I_{HNB}/I_p$, $I_{HWB}/I_p$, $I_{LNB}/I_{LWB}$, $I_{LNB}/I_{HNB}$, $I_{LNB}/I_{HWB}$, $I_{LWB}/I_{HNB}$, $I_{LWB}/I_{HWB}$, etc. These detector signals and ratios may be compared to expected ratios, may be used to construct the total wafer population, can be used to compare each mesa/LED ratio to the distribution of the total wafer population, etc. Also, as noted, the detector signals and the ratios can be used to estimate the energy distribution curve of each mesa/LED. The estimated distribution can be compared to expected distribution or to the distribution of the total population of the wafer. The results of such analysis can be used to monitor the production line and/or to bin the wafers/LEDs.

To provide a numerical example, assume that the system records two channels. Ch1 integrates all wavelengths (panchromatic), while Ch2 integrates wavelengths from 470-600 nm. If the LED target wavelength is 470 nm, the expected ratio for Ch2/Ch1 is then. Consequently, a measured ratio of 0.6 means that either the spectrum is red-shifted, i.e. the peak wavelength is higher than the desired 470 nm, or the ratio of the emission linewidths (long wavelength vs short wavelength) has changed significantly. By recording additional channels, e.g. Ch3 integrating a narrow band below the desired 470 nm, e.g. 450-460 nm, and Ch. 4 integrating a narrow band above the desired 470 nm, e.g., 480-490 nm, it can be determined if the change in ratio of Ch2/Ch1 is due to a peak shift or a change in linewidth/symmetry of emission spectrum.

The analysis in 305 can be used to identify extremes, i.e., regions/mesas which do not fit the expected distribution. When the expected distribution is known, e.g., when the scan is performed on wafers that undergo a mature fabrication process, the distribution can be simply compared to a reference distribution, e.g., of a "golden wafer." Conversely, when no reference is available, or when desiring to determine the within wafer distribution, the distribution of the total population (of the scanned wafer or of a plurality of previously scanned wafers) can be used as the reference, and the distribution of each region can be compared to the reference. It is expected that intensity distribution within any good region is equivalent to the total population distribution.

FIG. 4 illustrate intensity distribution plot of the total population of LEDs within a wafer. Plotted separately (inside the ovals) are intensity distribution of two regions within the wafer. As can be seen, one of the plots somewhat resembles the total population distribution plot, albeit shifted to the right a bit. This region can be considered as acceptable. Conversely, the second plot is drastically shifted to the left and its distribution does not resemble the total population distribution and therefore may be considered unacceptable.

With the analysis done at 305, it is possible to identify the spatial regions that fall outside of the specification. Moreover, when the resolution is set such that data is collected for each individual mesa/LED, the regions may correspond to a specific LEDs. In this respect, as used herein the term region may encompass a single mesa/LED or a specific mesa/LED and a few neighbouring mesas/LEDs. For example, it is possible to determine sub-populations from the extremes of the population distribution based on pre-defined percentiles (for example the worst 0.1%, top 0.1% and median 1%), the filtering done based on performance characteristics such as intensity of a given channel (point detector), ratio of two channels, etc.

Once step 310 is completed, in 315 it can be determined whether to proceed to the process of module 2. For example, if the inspection of module 1 is performed to monitor a mature production line, it may not be necessary to proceed to module 2 or 3, since all that may be required is to identify whether an excursion in the process has occurred, or to validate that the process is stable and production can proceed. In addition, under such condition the process of module 1 may be used to bin the LEDs during production. That is, the emission spectra of the LEDs correspond to the color of the light the LED would emit during operation. Thus, for example, the inspected LEDs can be binned according to the energy of the peak intensity, according to the width at FWHM, according to asymmetry of the intensity distribution, etc.

If at step 315 the decision is made to proceed to module 2, e.g., during process development or prior to manufacturing process maturing, a high resolution review scan is performed on only selected regions that were identified as being extreme. When no "golden" reference is available, the review scan may be performed on localized regions selected from the worst, best, and median performing regions identified in step 310. When golden reference is available, the review may be performed only for the worst performing localized regions so as to further investigate the causes for their failure.

For the review scan 320 the point detectors are operated at a higher sampling rate than during the fast scan, such that more information can be collected from each scanned region, e.g., from each selected mesa. For example, the review scan may be set to generate more than 16×16 and up to 64×64 pixels per mesa. Moreover, during the review scan other data is collected, such as full spectra using the CCD, SE imaging, etc. The data collected during the review scan is analyzed at 325. For example, the high resolution CL images can be assessed for emission intensity and homogeneity, threading dislocation density (See, e.g., U.S. Ser. No. 17/537,422). Also, when the local region scanned includes the specific mesa and its immediate neighbors, the spectra of the specific mesa can be compared to the spectra of the immediate neighbors. The SE image can be assessed for the shape of the mesa (e.g., by comparison to a reference "golden" shape or by line tracing of the periphery of the mesa), presence of particles, such as etch deposits, and presence mask transfer errors, such as uniformity. Also, image processing and machine vision techniques, such as edge tracing and feature recognition can be used to assign a shape uniformity factor (SUF). The full spectrum data, e.g., from the CCD, may be assessed for high-spatial resolution peak emission per wavelength, FWHM, total intensity, etc.

As noted, for various considerations, such as within wafer uniformity, the review scan and analysis can be based on randomly sampling the best, median and worst performers of the population based on the fast scan results. By randomly sampling the best, median and worst performers of the population and assessing the variance in the sampled mesas/LEDs, the performance of each region can be assessed relative to the process control limits.

Figure 5:
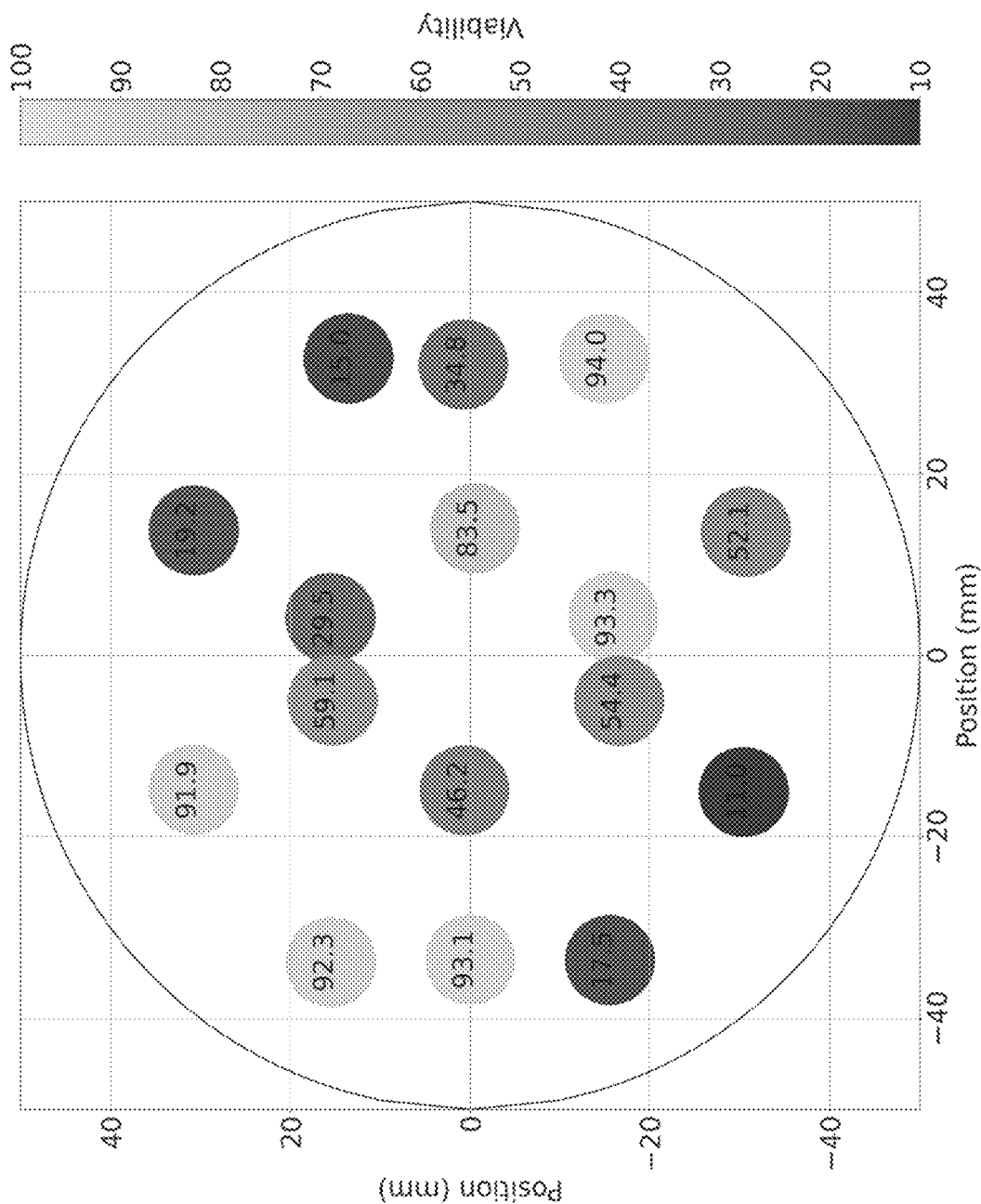
FIG. 5 is a map of regional viability score according to an embodiment.

The analysis performed in 325 may be used in step 330 to assign a viability score to various regions. In an embodiment, the viability score ranges from 10 to 100, and depends on population distribution with respect to a given process window, e.g., regional level, wafer level, cassette level, etc. FIG. 5 illustrates a regional viability score calculated with respect to a wafer level process window. Calculating the regional viability score helps identify high and low performing regions on the wafer as early as possible. In an embodiment, the viability regions are divided into three levels. High viability regions (HVR) are regions wherein even low performing mesas/LEDs are likely to be within the specification. If further metrology is performed on the wafer, these regions can be skipped to thereby reduce the metrology time. Low viability regions (LVR) are regions wherein even the best performing mesas/LEDs are likely to be out of spec. In this case as well there is no need to expand further metrology to investigate these regions. The regions of most interest are the borderline viability regions (BVR). These regions are likely to have mesas/LEDs that are within the spec and mesas/LEDs outside the spec. Thus, metrology efforts should be focused only on those regions.

Step 330 may be very beneficial in certain circumstances. For example, early identification of low viability regions supports WIP reduction by reducing the feedback time on critical process steps. Also, it lowers the total probing cost by optimizing the time spent in later metrology stages and more effectively allocating probing time budget. It can also support faster time to market as it helps understanding earlier which process changes affect viability more than others.

Figure 6:
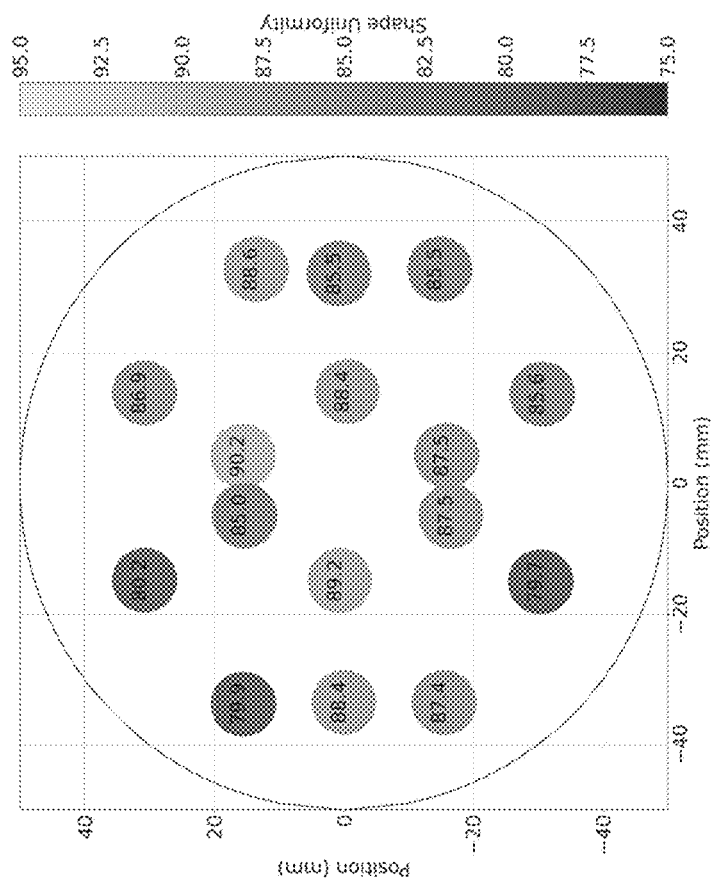
FIG. 6 is a map of shape uniformity score according to an embodiment.

In addition to the regional viability score map illustrated in FIG. 5, other maps can be generated to assist in process development and monitoring and in binning. For example, since the review scan generates high resolution image of individual mesas, the shape of each mesa can be analyzed for uniformity. FIG. 6 illustrates a shape uniformity scoring map, which may indicate problems with the photolithography stage or the etch stage.

Figure 7:
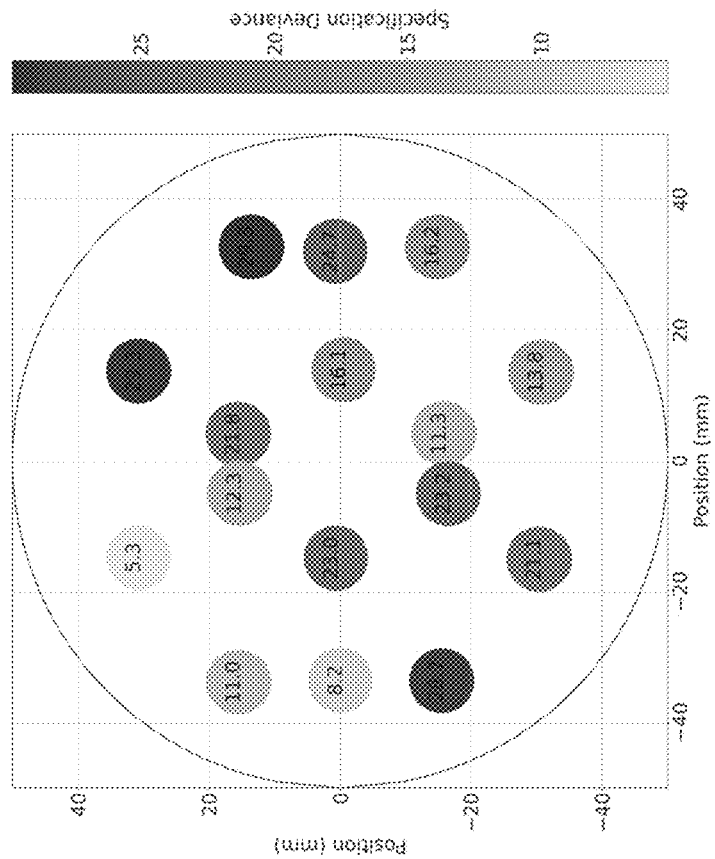
FIG. 7 is a map of specification deviation score according to an embodiment.

Similarly, FIG. 7 illustrates a deviation score mapping, which may be implemented for various parameters of the wafer. The score correlates with how much the results deviate from the defined process window. That is, the score in each region indicates the deviance from the specification. This can be done, for example, for the wavelength at the peak intensity (correlating with the LED color), to the width at the FWHM (correlating with color sharpness/broadening), etc.

At step 335 a determination may be made whether to proceed to optional module 3, which involves in-depth investigation of specific mesas/LEDs within the wafer. In step 340 an ultra-high resolution review is performed. The ultra-high resolution review module 3 is of particular interest in process development phases and in identification of key redactors, as measurements can be performed immediately before and after a particular frontend process step, for example a mesa etching process, in order to better understand the process interaction with the optoelectronic properties of the device. Improved understanding of epi—process steps interactions leads ultimately to better process control through better definition of Key Performance Indicators (KPIs) and discovery of new KPIs.

In the ultra-high resolution scan 340, the resolution is set to 64×64 pixel per mesa or higher. With respect to spatial resolution, the ultra-high resolution is set to 100 nm or better, e.g., from 20 nm to 100 nm, inclusive. In this scan, either a high resolution panchromatic/filtered dataset is collected, or a hyper-spectral data is collected per mesa using, e.g., the CCD. The hyper spectral data acquisition in this step need not be spatially resolved, albeit it can be by using the resolution specified herein. When not spatially resolved, a field of view is defined (e.g., 16×16 pixels) and the area is scanned with the e-beam while the emission is collected by the CCD. The CCD buffer is read only after a pre-set integration time. This mode can be referred to as time-integrated scanning mode.

Figures 8, 9:
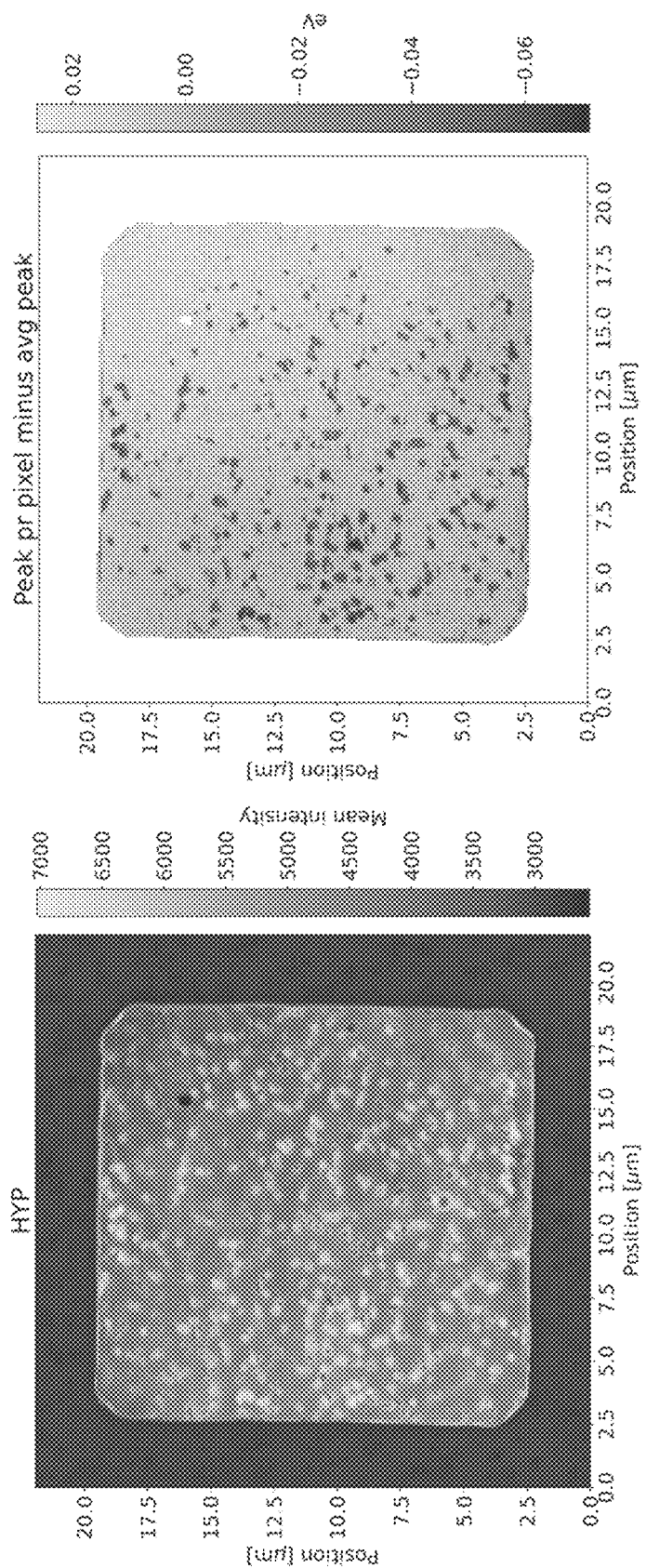
FIG. 8 is a CL hyperspectral image of a mesa of micro LED according to an embodiment.
FIG. 9 is a peak emission energy (wavelength) per pixel minus peak emission energy of a mesa of micro LED, according to an embodiment.

The first type of collection can, for example, be analysed to identify per mesa: the treading dislocation density, emission wavelength homogeneity, intensity homogeneity, mesa edge shape, mesa uniformity, etc. The hyper spectral map can be analysed to determine all of the previous points, as well as other metrics such as peak emission energy or FWHM and other related parameters such as shown in FIG. 9. FIG. 8 illustrates a hyper-spectral intensity map for a single mesa, which was obtained from the ultra-high resolution scan. FIG. 9 is a hyperspectral map of the same data as FIG. 8, but illustrates a map of peak emission energy minus the average energy for each mesa, which was obtained from the ultra-high resolution scan. In the plot of FIG. 9 it is presented as an energy shift by subtracting the average peak emission energy from the data. The pixels (in the map) with a positive energy shift mean that the emission is shifted more towards the blue wavelength range (compared to the average) and those with a negative energy shift represent a shift towards the red wavelength range.

Figure 10:
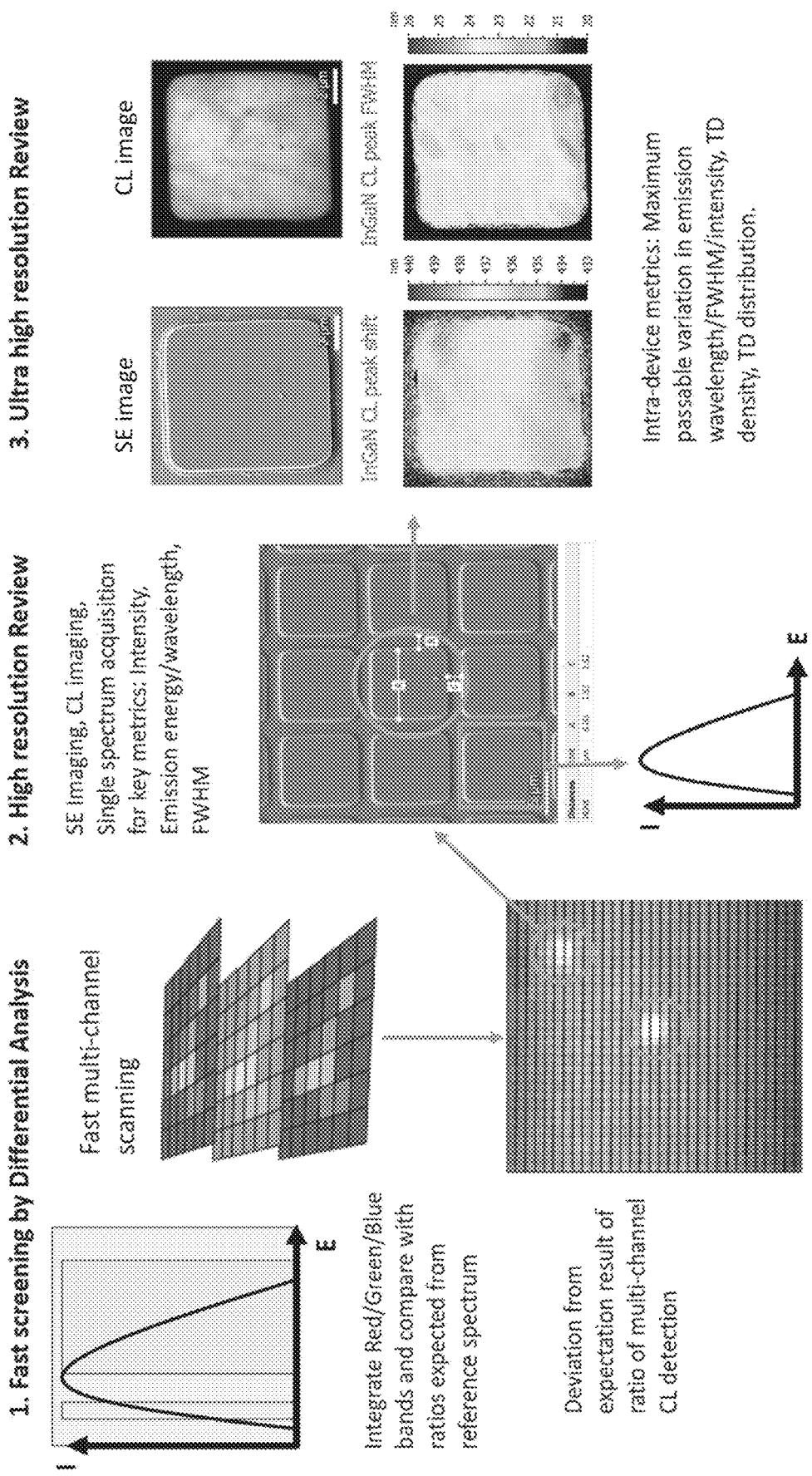
FIG. 10 is a schematic illustrating a process flow of micro LED wafer inspection method according to an embodiment.

With the embodiments disclosed herein, different methods for inspecting micro LEDs using CL microscope can be tailored to provide the proper information during process development and device fabrication. The various modules disclosed in conjunction with the flow chart of FIG. 3 can be implemented as needed, utilizing the CL microscope according to the example illustrated in FIG. 2. The general flow is illustrated in FIG. 10, wherein in module 1 fast multi-channel scanning of the wafer, or large global areas thereof, is performed, while multiple point detectors receive split beams passing through different filters. The signals of the various filtered bands (e.g., red, green and blue filters) are integrated and different ratios of the channels are generated. The results can be compared to an expected result, or to an average result obtained from the total population of the wafer.

Local regions having appreciable deviation from the expected result are selected for high resolution scan in module 2. The scanning is done over a specific mesa and its nearest neighboring mesas. During the scan various imaging can be performed, e.g., SE imaging, CL hyperspectral imaging, CL filtered/single spectrum imaging, etc. This imaging information can be analyzed to obtain, e.g., intensity, peak emission energy or FWHM, shape of the mesa, space between mesas, etc. In module 3 specific mesas are selected for ultra-high resolution review. The ultra-high resolution scanning generates high spatial resolution images of specifically selected mesas, such as SE image, CL image, CL peak shift, CL peak FWHM, etc., so as to investigate the characteristics of specific mesas.

In an embodiment, an inspection method is provided for micro LEDs, utilizing CL microscope, comprising: performing a first scan at a first resolution of a global area of the wafer using a plurality of point detectors, i.e., single channel detectors such as PMTs or biased photodiodes, wherein a plurality of optical filters, different from each other, are inserted in an optical path of at least a subset of the plurality of point detectors. The optical filters may include edge pass, bandpass or filters with more complex transmission properties. When several bandpass filters are used, either the central frequency or the bandwidth is different among all the filters. The scanned global area can be the entire wafer, or a subarea of the wafer of a size which would statistically meaningfully represent the entire wafer. Next the method analyses the population distribution of the measured global area by determining the ratios of the recorded single channels and comparing the ratios to that expected from a reference spectrum. The reference spectrum may be constructed using the data collected for the entire population within the scanned global area. Thereafter the method determines sub-populations from the extremes of the population distribution based on pre-defined percentiles (for example the worst 0.1%, best 0.1% and median 1%), based on performance characteristics, such as intensity of a given channel, ratio of two channels, etc.

Once the sub-populations have been identified, the method may proceed to a review scan, wherein the sub-populations are scanned at a second resolution, higher than the first resolution. During the scan of localized regions, the method obtains high resolution panchromatic images, high resolution SE images, a hyperspectral map and/or areal averaging hyperspectral acquisition map. The sampling rate of the sub-populations can be determined by the requisite throughput criteria and each localized region may include a specific mesa and its immediate neighbouring mesas. The hyperspectral properties of the reviewed mesas are compared to the pre-defined process control limits, or to expected results determined from averaging the results of all of the sampled population to obtain a reference. Then, for each of the sub-populations, the relevant performance criteria is evaluated to estimate the fraction of the reconstructed population that falls within the pre-defined process window. The process criteria may include any combination of: total emission intensity, emission wavelength per energy, emission FWHM, asymmetry of the emission spectrum (e.g., the ratio of the low energy half maximum to high energy half maximum, which affects colour rendering), shape uniformity factor (corresponding to the mesa's shape with respect to a reference shape), threaded dislocation density, etc. The score for each of these performance criteria are combined, optionally using weighting, to generate a regional viability score. The weighting may be determined according to the process sensitivity to the individual metrics.

In an embodiment, an inspection method is provided for micro LEDs, utilizing a CL microscope, comprising: performing a first scan of a global area of the wafer using a plurality of point detectors, i.e., single channel detectors such as PMTs or biased photodiodes, wherein a filtering arrangement limits the bandwidth of light directed to at least a subset of the plurality of point detectors. The filtering arrangement may include edge pass, bandpass, dichroic mirrors, biased wafers, or filters with more complex transmission properties. The scanned global area can be the entire wafer, or a subarea of the wafer which would statistically meaningfully represent the entire wafer. Next the method analyses the population distribution of the measured global area by determining the ratios of the recorded single channels and comparing the ratios to that expected from a reference spectrum. The reference spectrum may be constructed using the data collected for the entire population within the scanned global area.

In this embodiment, no review scan is performed. Instead, the process proceeds to compare the measured population distributions of mesas to the pre-defined process control limits. The process then determines a parameter performance metrics for all relevant performance criteria, by calculating the fraction of the population distribution that falls within the process control limits. The process criteria may include any combination of: total emission intensity, emission wavelength per energy, emission FWHM (estimated by combining the multiple single channel intensity ratios), asymmetry of the emission spectrum (e.g., the ratio of the low energy half maximum to high energy half maximum, which affects colour rendering). The score for each of these performance criteria are combined, optionally using weighting, to generate a regional validity score. With respect to the flow of FIG. 3, this means that step 330 is performed after step 310. The weighting may be determined according to the process sensitivity to the individual metrics.

With this disclosure, a method for fabricating micro LEDs is provided, comprising: forming a plurality of mesas on a wafer, wherein length of each mesa is 100 microns or less, transferring the wafer into a CL microscope; performing a first scan of the wafer at a first resolution to generate a plurality of CL beams; using a plurality of single point detectors to simultaneously detect the plurality of CL beams, wherein each of the point detectors is arranged to receive a different partial spectrum than the remaining point detectors; generating a plurality of detector ratios, wherein each of the detector ratio comprises a ratio of signals received from two of the point detectors; and comparing the detected ratios to expected ratios to determine properties of the mesas.

Also, a method for inspecting a wafer having a plurality of mesas for forming micro LED in each mesa is provided, wherein each mesa having length of 100 microns or less, the method comprising: placing the wafer in a CL microscope; performing a first scan of the wafer at a first resolution to generate a plurality of CL beams; using a plurality of single point detectors to simultaneously detect the plurality of CL beams, wherein each of the point detectors is arranged to receive a different partial spectrum than the remaining point detectors; generating a plurality of detector ratios, wherein each of the detector ratios comprises a ratio of signals received from two of the point detectors; and comparing the detected ratios to expected ratios to determine properties of the mesas. The first resolution may be set to generate at least one pixel per mesa and up to 10×10 pixels per mesa. One of the plurality of point detectors may be arranged to receive spectrum of wavelengths higher than background wavelengths, e.g., higher than 400 nm. The method may further comprise using the signals received from the plurality of detectors to reconstruct the spectral emission at each of the scanned mesas. The method may also comprise using the signals received from the plurality of detectors to determine asymmetry of CL emission at each of the scanned mesas. The method may include using the signals received from the plurality of detectors to determine intensity distribution at each of the scanned mesas and comparing to total population intensity distribution determined from all of the scanned mesas. The signals received from the plurality of detectors may be used to assign the scanned mesas into a plurality of groups. The signals received from the plurality of detectors can be used to identify regions of interest on the wafer and then performing a second scan of the regions of interest at a second resolution, higher than the first resolution, to generate an inspection signal; and then using the inspection signal determining peak emission per wavelength within each scanned regions of interest. Also, during the second scan secondary electron detector can be used to form secondary electron image of each of the scanned regions of interest. Image processing can be used to determine physical shape of each mesa within the scanned regions of interest. The secondary electron images can be inspected to identify contaminants within the scanned regions of interest. A viability score can be assigned to each of the scanned regions of interest.

As disclosed with respect to FIG. 2, a cathodoluminescence microscope for inspecting wafers having a plurality of micro LED mesas formed therein is provided, comprising: an electron beam column having an electron source, a magnetic lens for focusing electrons emitted from the electron source to thereby form an electron beam, and a scanner scanning the electron beam over the sample; a light objective collecting light emitted from the sample in response to the scanning of the electron beam and forming a light beam; an imaging section comprising a focusing lens, splitter arrangement splitting the light beam into a plurality of split beams, a plurality of point detector, each positioned to receive one of the split beams, and a filter arrangement limiting the bandwidth of at least a subset of the plurality of split beams; and, a controller receiving output signals from the plurality of point detectors and generating ratios of paired output signals of the plurality of point detector. The point detectors may comprise: a biased photodiode, avalanche photodiode, amplified photodiode or photomultiplier tube (PMT). The cathodoluminescence microscope may further comprise a background filter blocking wavelengths below 400 nanometers. The filter arrangement may comprise at least one dichroic mirror, a plurality of band-pass filters having different central frequency or different bandwidth, or at least one biased LED wafer. The controller may compare the ratios to reference ratios and identifies regions of the wafer having ratios deviating from the reference ratios. The controller may further assign viability scores to the regions.

Disclosed embodiments include a cathodoluminescence microscope for inspecting wafers having a plurality of mesas formed therein, the microscope comprising: an electron beam column having an electron source, a magnetic lens for focusing electrons emitted from the electron source to thereby form an electron beam, and a scanner scanning the electron beam over a wafer; a light objective collecting CL light emitted from the sample in response to the scanning of the electron beam and forming a CL light beam; a beam splitting arrangement simultaneously generating a plurality of split beams from the CL light beam, wherein the plurality of split beams are inherently registered both spatially and temporally; a filter arrangement positioned to intersect an optical path of at least one of the CL light beam or at least one of the split beams; and a plurality of point detectors, each positioned to detect one of the split beams. The filter arrangement may comprise one of: a plurality of bandpass filters, at least one dichroic mirror, and a biased LED wafer, and may include a background filter that blocks emissions below 400 nm. Also a controller may be included, integrating the signals received from each of the point detectors to generate a plurality of integrated emissions.

Disclosed embodiments also provide a computer program stored in a storage device, for inspecting a wafer having a plurality of mesas, that, when executed by a computer causes the computer to execute steps comprising: receiving a first electrical signal corresponding to a first filtered cathodoluminescence beam emitted from one of the mesas and a second electrical signal corresponding to a second filtered cathodoluminescence beam emitted from the mesa and having different filtered wavelengths from the first filtered cathodoluminescence beam; integrating the first and second electrical signals to generate first integrated signal and second integrated signal; using the first and second integrated signals to reconstruct an emission spectra curve of the mesa; analysing the emission spectra curve to determine characteristics of the mesa. Analysing the emission spectra curve may include determining peak wavelength shift, emission intensity variation, or full width at half maximum. The process may further comprise assigning viability score to each region of the wafer according to the emission spectra curve.

Further embodiments include a method of operating a cathodoluminescence microscope to determine physical and optical properties of mesas within a semiconductor wafer for fabrication of micro LEDs, comprising: scanning an area of the wafer with an electron beam at a first resolution; collecting cathodoluminescence light emitted from the area during the scanning and forming a light beam from the cathodoluminescence light; splitting the light beam into a plurality of split beams; filtering at least a subset of the plurality of split beams; using a plurality of point detectors to simultaneously detect the split beams and generate a plurality of electrical signals, each corresponding to intensity of one of the split beams at a filtered frequency; analysing the plurality of signals to identify suspect regions within the wafer.

The method may further comprise scanning each of the suspect regions with the electron beam at a second resolution, higher than the first resolution; collecting cathodoluminescence light emitted from the suspect region during the scanning and forming a second light beam from the cathodoluminescence light; splitting the second light beam into a plurality of second split beams; inserting the plurality of filters in the optical path of the subset of the second split beams; using the plurality of point detectors to simultaneously detect the second split beams and generate a second plurality of electrical signals, each corresponding to one of the second split beams; analysing the plurality of second signals to assign a viability score to each of the suspect regions. The method may also comprise detecting secondary electrons emitted from the suspect region and analysing an image generated by the secondary electrons to determine the shape of mesas within the suspect region; and/or detecting secondary electrons emitted from the suspect region and determining whether contaminants are present within the suspect region; and/or generating a full spectrum cathodoluminescence image using an assembly of a spectrograph and a detector array to detect the second light beam.

While the invention has been illustrated and described in detail in the drawings and foregoing description, such illustrations and descriptions are to be considered illustrative or exemplary and not restrictive, the invention being not limited to the disclosed embodiments. Other embodiments and variants are understood, and can be achieved by those skilled in the art when carrying out the claimed invention, based on a study of the drawings, the disclosure and the appended claims.

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used. Any reference signs in the claims should not be construed as limiting the scope of the invention.

The invention claimed is:

1. A cathodoluminescence microscope for inspecting samples having a plurality of micro LED mesas formed therein, comprising:
    an electron beam column having an electron source, a magnetic lens for focusing electrons emitted from the electron source to thereby form an electron beam, and a scanner scanning the electron beam over the sample;
    a light objective collecting light emitted from the sample in response to the scanning of the electron beam and forming a light beam;
    an imaging section comprising a focusing lens, splitter arrangement splitting the light beam into a plurality of split beams, a plurality of point detector, each positioned to receive one of the split beams, and a filter arrangement limiting the bandwidth of at least a subset of the plurality of split beams; and,
    a controller receiving output signals from the plurality of point detectors and generating ratios of paired output signals of the plurality of point detector.

2. The cathodoluminescence microscope of claim 1, wherein the point detectors comprise: a biased photodiode, avalanche photodiode, amplified photodiode or photomultiplier tube (PMT).

3. The cathodoluminescence microscope of claim 1, further comprising a background filter blocking wavelengths below 400 nanometers.

4. The cathodoluminescence microscope of claim 1, wherein the filter arrangement comprises at least one dichroic mirror.

5. The cathodoluminescence microscope of claim 1, wherein the filter arrangement comprises a plurality of band-pass filters having different central frequency or different bandwidth.

6. The cathodoluminescence microscope of claim 1, wherein the filter arrangement comprises at least one biased LED wafer.

7. The cathodoluminescence microscope of claim 1, wherein the controller compares the ratios to reference ratios and identifies regions of the sample having ratios deviating from the reference ratios.

8. The cathodoluminescence microscope of claim 7, wherein the controller further assigns viability scores to the regions.

9. A method for inspecting a wafer having a plurality of mesas for forming micro LED in each mesa, wherein each mesa having length of 100 microns or less, comprising:
    placing the wafer in a CL microscope;
    performing a first scan of the wafer at a first resolution to generate a plurality of CL beams;
    using a plurality of single point detectors to simultaneously detect the plurality of CL beams, wherein each of the point detectors is arranged to receive a different partial spectrum than the remaining point detectors;
    generating a plurality of detector ratios, wherein each of the detector ratios comprises a ratio of signals received from two of the point detectors; and
    comparing the detected ratios to expected ratios to determine properties of the mesas.

10. The method of claim 9, wherein the first resolution is set to generate at least one pixel per mesa and up to 10×10 pixels per mesa.

11. The method of claim 9, wherein one of the plurality of point detectors is arranged to receive spectrum of wavelengths higher than background wavelengths.

12. The method of claim 9, further comprising using the signals received from the plurality of detectors to reconstruct the spectral emission at each of the scanned mesas.

13. The method of claim 9, further comprising using the signals received from the plurality of detectors to determine asymmetry of CL emission at each of the scanned mesas.

14. The method of claim 9, further comprising using the signals received from the plurality of detectors to determine intensity distribution at each of the scanned mesas and comparing to total population intensity distribution determined from all of the scanned mesas.

15. The method of claim 9, further comprising using the signals received from the plurality of detectors to assign the scanned mesas into a plurality of groups.

16. The method of claim 9, further comprising:
    using the signals received from the plurality of detectors to identify regions of interest on the wafer;
    performing a second scan of the regions of interest at a second resolution, higher than the first resolution, to generate an inspection signal; and,
    using the inspection signal to determine peak emission per wavelength within each scanned regions of interest.

17. The method of claim 16, further comprising using secondary electron detector to form secondary electron image of each of the scanned regions of interest.

18. The method of claim 17, further comprising using image processing to determine physical shape of each mesa within the scanned regions of interest.

19. The method of claim 17, further comprising inspecting the secondary electron images to identify contaminants within the scanned regions of interest.

20. The method of claim 16, further comprising assigning a viability score to each of the scanned regions of interest.

* * * * *